(12) United States Patent
Umeta et al.

(10) Patent No.: US 11,390,949 B2
(45) Date of Patent: Jul. 19, 2022

(54) SIC CHEMICAL VAPOR DEPOSITION APPARATUS AND METHOD OF MANUFACTURING SIC EPITAXIAL WAFER

(71) Applicant: SHOWA DENKO K.K., Tokyo (JP)

(72) Inventors: Yoshikazu Umeta, Chichibu (JP); Hironori Atsumi, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/699,360

(22) Filed: Nov. 29, 2019

(65) Prior Publication Data
US 2020/0173023 A1 Jun. 4, 2020

(30) Foreign Application Priority Data
Dec. 3, 2018 (JP) .............................. JP2018-226466

(51) Int. Cl.
*C23C 16/46* (2006.01)
*C23C 16/32* (2006.01)
*H01L 21/02* (2006.01)

(52) U.S. Cl.
CPC ............ *C23C 16/46* (2013.01); *C23C 16/325* (2013.01); *H01L 21/02167* (2013.01); *H01L 21/02271* (2013.01)

(58) Field of Classification Search
None
See application file for complete search history.

(56) References Cited

U.S. PATENT DOCUMENTS

| 9,879,359 B2 * | 1/2018 | Fujibayashi ...... C23C 16/45553 |
| 2011/0265710 A1 * | 11/2011 | Suzuki .................... C30B 29/36 117/85 |
| 2016/0138190 A1 * | 5/2016 | Fujibayashi ...... C23C 16/45548 117/102 |

FOREIGN PATENT DOCUMENTS

| DE | 11 2017 001 127 T5 | 11/2018 |
| JP | 2009-074180 A | 4/2009 |

OTHER PUBLICATIONS

Communication dated Aug. 4, 2021 by the German Patent Office in German Application No. 102019132074.7.

* cited by examiner

*Primary Examiner* — Long Pham
(74) *Attorney, Agent, or Firm* — Sughrue Mion, PLLC

(57) ABSTRACT

A SiC chemical vapor deposition apparatus is provided, including: a furnace body inside of which a growth space is formed; and a mounting table which is positioned on a lower portion of the growth space and has a mounting surface on which a SiC wafer is mounted, in which the furnace body is separated into a plurality of members in a vertical direction substantially orthogonal to the mounting table, the plurality of members includes a first portion and a second portion, the first portion includes a protruding part that protrudes in an outer peripheral direction, the second portion includes a hook part on which the protruding part is hung, and the first portion and the second portion are connected to each other by hanging the hook part on the protruding part.

8 Claims, 4 Drawing Sheets

SIC CHEMICAL VAPOR DEPOSITION APPARATUS AND METHOD OF MANUFACTURING SIC EPITAXIAL WAFER

BACKGROUND OF THE INVENTION

Field of the Invention

The present invention relates to a SiC chemical vapor deposition apparatus and a method of manufacturing a SiC epitaxial wafer.

Priority is claimed on Japanese Patent Application No. 2018-226466, filed on Dec. 3, 2018, the content of which is incorporated herein by reference.

Description of Related Art

Silicon carbide (SiC) has properties including a dielectric breakdown electric field of one digit larger, a band gap of three times larger, and thermal conductivity of three times higher than those of silicon (Si). Since SiC has these properties, silicon carbide is expected to be applied to a power device, a high-frequency device, a high-temperature operation device, and the like. Therefore, in recent years, a SiC epitaxial wafer has been used for the above SiC devices.

The SiC epitaxial wafer is manufactured by epitaxially growing a SiC epitaxial film, which becomes an active region of a SiC semiconductor device, on a SiC substrate (a SiC wafer or a wafer). The SiC wafer is obtained by processing from a SiC bulk single crystal produced by a sublimation method or the like, and the SiC epitaxial film is formed by a chemical vapor deposition (CVD) apparatus.

The SiC bulk single crystal obtained by the sublimation method is produced using a crucible. A raw material powder is placed in a lower part of a region covered with a crucible, and a seed crystal is placed in a ceiling portion. When heating the raw material powder from an outer periphery of the crucible, the sublimated raw material is recrystallized on a surface of the seed crystal to obtain a SiC bulk single crystal.

On the other hand, the chemical vapor deposition apparatus includes a furnace body that forms a growth space inside, a mounting table disposed in the growth space, and heating device that is located outside the furnace body or inside the mounting table. A SiC wafer is mounted on the mounting table. In the chemical vapor deposition apparatus, a raw material gas is supplied into the growth space so that flow is not disturbed, and the vicinity of the SiC wafer is heated by radiant heat by the heating device, thereby forming a thin SiC epitaxial film on the surface of the SiC wafer.

For example, Japanese Unexamined Patent Application, First Publication No. 2009-74180 describes a chemical vapor deposition apparatus for producing a SiC epitaxial wafer. The SiC epitaxial wafer is formed in a closed space that is closed by a single furnace body.

SUMMARY OF THE INVENTION

In order to promote a practical application of SiC devices using SiC epitaxial wafers, it is required to establish a high-quality and low-cost SiC epitaxial wafer and an epitaxial growth technique.

When the SiC epitaxial film is deposited multiple times using the chemical vapor deposition apparatus, a deposit may be formed on an inner wall of the furnace body. The deposit is SiC attached to the inner wall of the furnace body. The deposit causes particles, and can cause a defect when the deposit is dropped on a SiC substrate. However, cleaning an inside of the furnace body every time may cause a reduction in production throughput.

The present invention has been made in view of the above problems, and an object thereof is to provide a method of manufacturing a SiC epitaxial wafer, capable of reducing the cost of forming a SiC epitaxial film.

As a result of intensive studies, the present inventors have found that, when a furnace body is formed to have a separable structure, only a furnace body lower part on which a deposit is likely to occur can be replaced and it is possible to reduce the cost of manufacturing a SiC epitaxial wafer.

That is, the present invention provides apparatus as follows in order to solve the problems.

(1) According to a first aspect of the present invention, a SiC chemical vapor deposition apparatus is provided, including: a furnace body inside of which a growth space is formed; and a mounting table which is positioned on a lower portion of the growth space and has a mounting surface on which a SiC wafer is mounted, in which the furnace body is separated into a plurality of members in a vertical direction substantially orthogonal to the mounting table, the plurality of members includes a first portion and a second portion, the first portion includes a protruding part that protrudes in an outer peripheral direction, the second portion includes a hook part on which the protruding part is hung, and the first portion and the second portion are connected to each other by hanging the hook part on the protruding part.

(2) In the SiC chemical vapor deposition apparatus according to (1), the furnace body may be separated into a furnace body upper part and a furnace body lower part, the first portion may be the furnace body lower part, and the second portion may be the furnace body upper part.

(3) In the SiC chemical vapor deposition apparatus according to (1) or (2), the protruding part may be positioned at an upper end of the first portion, and the hook part may be positioned at a lower end of the second portion.

(4) In the SiC chemical vapor deposition apparatus according to any one of (1) to (3), the hook part may be a fitting part that fits the protruding part, and the fitting part may be a portion recessed in the outer peripheral direction, in an inner surface of the furnace body upper part.

(5) In the SiC chemical vapor deposition apparatus according to any one of (1) to (4), a thickness of the furnace body may be 0.5 mm or more and 10 mm or less.

(6) In the SiC chemical vapor deposition apparatus according to any one of (1) to (5), in the furnace body, an inner wall of the furnace body lower part and an inner wall of the furnace body upper part may be substantially flush with each other.

(7) In the SiC chemical vapor deposition apparatus according to any one of (1) to (6), the furnace body lower part may be provided with heating device.

(8) According to a second aspect of the present invention, a method of manufacturing a SiC epitaxial wafer is provided using the SiC chemical vapor deposition apparatus according to the first aspect.

According to the method of manufacturing a SiC epitaxial wafer of the aspect, the cost of manufacturing the SiC epitaxial wafer can be reduced.

DETAILED DESCRIPTION OF THE INVENTION

Figure 1:
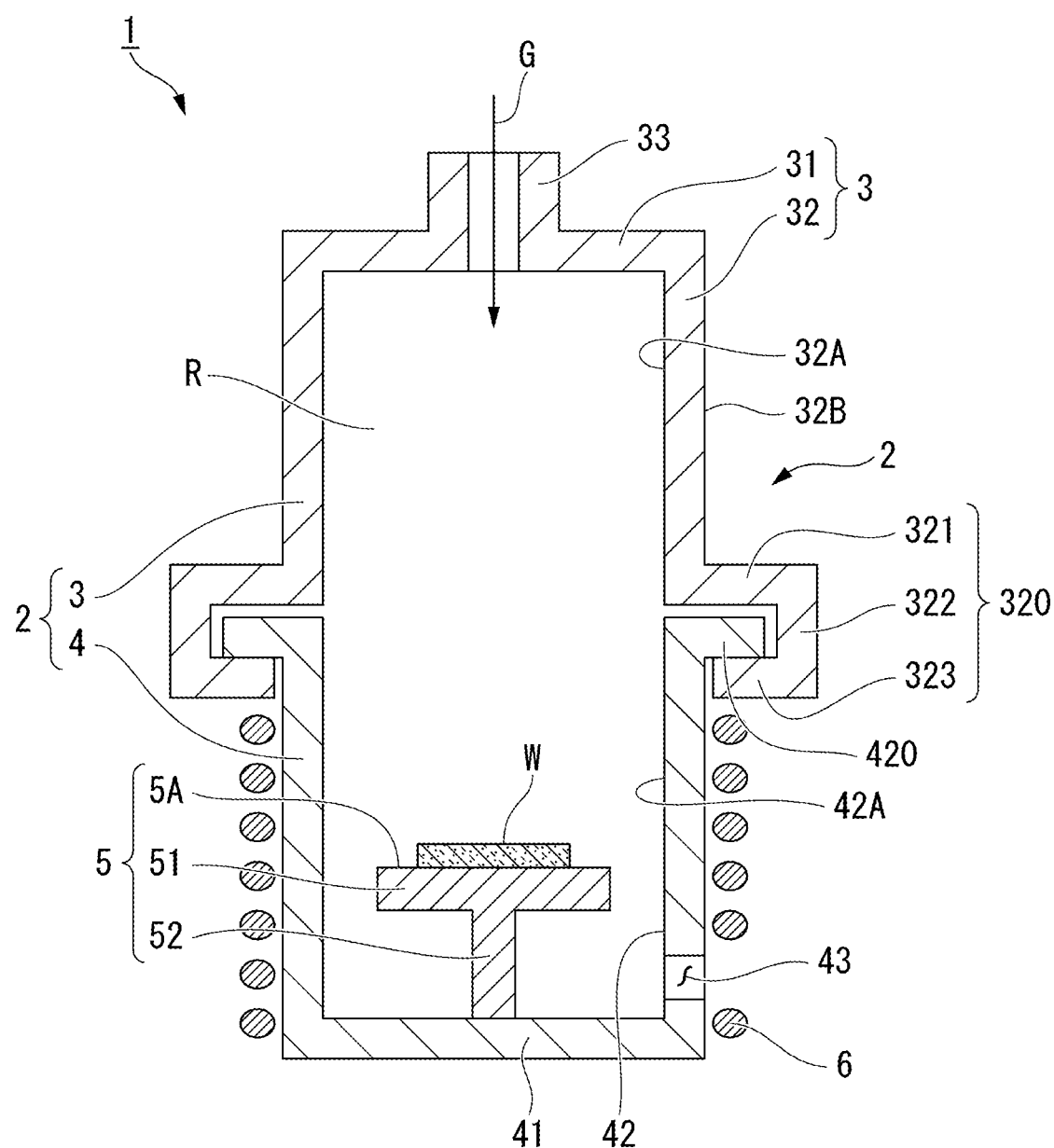
FIG. 1 is a schematic sectional diagram of a chemical vapor deposition apparatus according to an embodiment of the present invention.

Hereinafter, an example of a SiC chemical vapor deposition apparatus obtained by applying the present invention will be described in detail with reference to drawings as appropriate.

In the drawings used in the following description, to make features of the present invention easier to understand, for the sake of convenience, a featured portion may be enlarged and shown in some cases, and a dimensional ratio of each component may be different from an actual one. In addition, in the following description, a material, a dimension, and the like to be exemplified are examples. The present invention is not limited thereto, and can be performed with appropriate modifications within the scope not changing the gist thereof.
<SiC Chemical Vapor Deposition Apparatus>

First Embodiment

FIG. 1 is a schematic sectional diagram of a SiC chemical vapor deposition apparatus 1 according to a first embodiment of the present invention. The SiC chemical vapor deposition apparatus 1 includes a furnace body 2 inside of which a growth space R is formed and a mounting table 5 which is positioned in the growth space R and on which a SiC wafer W is mounted.

In the present specification, for the sake of convenience, in the furnace body 2, a direction in which the mounting table 5 is positioned is referred to as a lower side, and a direction in which a first hole 33 to be described later is positioned with respect to the mounting table 5 is referred to as an upper side.
(Mounting Table)

The mounting table 5 includes, for example, a support 51 and a support column 52. The support 51 supports the SiC wafer W. An upper surface (a mounting surface) 5A of the support 51 is provided with the SiC wafer W or a susceptor (not shown). The support column 52 is a support shaft that extends downward from the support 51. The support column 52 is connected to, for example, a rotation mechanism (not shown). The support 51 is rotatable by rotating the support column 52 by the rotation mechanism.

The mounting table 5 may further include heating device. The heating device is provided inside the support 51. The heating device is, for example, a heater. The heating device is energized from the outside through an inside of the support column 52.
(Furnace Body)

The furnace body 2 includes the growth space R inside. The furnace body 2 shown in FIG. 1 is separated into a furnace body upper part 3 and a furnace body lower part 4. The furnace body lower part 4 is an example of a first portion, and the furnace body upper part 3 is an example of a second portion.

In a manufacturing process of a SiC epitaxial wafer, a deposit is likely to occur in the lower side of the furnace body. The deposit occurring in the lower side of the furnace body causes a defect when the deposit adheres to a surface of the SiC substrate. Therefore, when the deposits accumulate, it is often necessary to replace the furnace body. In the SiC chemical vapor deposition apparatus 1 according to the present embodiment, only the furnace body lower part 4 can be replaced, even when it is necessary to be replaced due to the deposit occurring in the furnace body lower part 4. A maintenance frequency of the SiC chemical vapor deposition apparatus 1 can be lowered and the throughput of the SiC epitaxial wafer can be improved. Since the furnace body is expensive, the cost burden can be reduced by reducing a portion to be replaced. Therefore, according to the SiC chemical vapor deposition apparatus 1 of the present embodiment, the cost necessary for providing the SiC epitaxial wafer can be suppressed.

In addition, heat conduction between the furnace body upper part 3 and the furnace body lower part 4 can be suppressed by separating the furnace body 2 into the furnace body upper part 3 and the furnace body lower part 4. That is, the heat conduction between the furnace body upper part 3 and the furnace body lower part 4 is inhibited. When the furnace body upper part 3 becomes a high temperature, a raw material gas supplied from the first hole 33 to be described later is decomposed, and the decomposed raw material gases react with each other to be recrystallized in the furnace body upper part 3. The recrystallized deposit causes a defect as described above. The occurrence of the deposit can be suppressed by suppressing the furnace body upper part 3 from becoming a high temperature. In addition, a temperature difference between the furnace body upper part 3 and the furnace body lower part 4 occurs, whereby the flow of the raw material gas due to the temperature difference is formed.

The furnace body upper part 3 includes a top part 31 and a side part 32. The top part 31 has, for example, the first hole 33. The first hole 33 is located at the upper side facing the mounting surface 5A of the mounting table 5.
(First Hole)

The first hole 33 is a raw material gas-introducing part through which the raw material gas G is introduced into the growth space R. The raw material gas G supplied from the first hole 33 reacts on the SiC wafer W mounted on the mounting surface 5A to form the SiC epitaxial film on the SiC wafer W. The SiC epitaxial wafer is manufactured by forming a SiC epitaxial film on the SiC wafer W. As the raw material gas G, for example, a known Si-based gas and a C-based gas are used.

Examples of the Si-based gas include silane ($SiH_4$). In addition to this, examples of the Si-based gas may include a chlorine-based Si raw material containing gas having Cl having etching action (chloride-based raw material), such as $SiH_2Cl_2$, $SiHCl_3$, and $SiCl_4$. In addition, examples of the Si-based gas may include a gas obtained by adding HCl to silane.

Examples of the C-based raw material gas include propane ($C_3H_8$).

Further, a purge gas may be supplied as a third gas simultaneously with these gases. The purge gas is a gas not containing Si or C, and an inert gas (rare gas) such as Ar or He can be used in addition to a gas that contains $H_2$ and has the etching action, such as HCl.

In addition, in a case of controlling a conductivity of the SiC epitaxial film to be stacked on the SiC wafer W, impurity doping gas may be supplied simultaneously with the raw material gas G. For example, in a case where a conductivity type is an n-type, the impurity doping gas is $N_2$, and in a case of using a p-type, the impurity doping gas is trimethylaluminum (TMA).

The Si-based gas, the C-based gas, the purge gas, and the impurity doping gas may be separately supplied or may be supplied by being mixed.

An average flow velocity the of raw material gas G to be supplied from the first hole 33 into the growth space R (Flow rate/Cross-sectional area of first hole 33) can be changed as appropriate, and examples thereof can include 0.001 m/s to 100 m/s.

The side part 32 of the furnace body upper part 3 extends in a direction substantially orthogonal to the top part 31. The side part 32 is, for example, cylindrical. The side part 32 includes a fitting part 320 at a lower end.

(Fitting Part)

A protruding part 420 of the furnace body lower part 4 to be described later is fitted to the fitting part 320. When the protruding part 420 is fitted to the fitting part 320, the furnace body upper part 3 and the furnace body lower part 4 are connected to each other, and an inside of the furnace body 2 is sealed.

The fitting part 320 includes an upper part 321, an end part 322, and a hanging part 323.

The upper part 321 of the fitting part 320 protrudes from the side part 32 in an outer peripheral direction. The upper part 321 extends, for example, in a direction substantially orthogonal to the side part 32. The end part 322 extends downward from one end of the upper part 321. The hanging part 323 extends, for example, in a direction substantially parallel to the upper part 321. Accordingly, the fitting part 320 is a portion recessed in the outer peripheral direction in the inner wall 32A of the furnace body upper part 3.

The fitting part 320 fits the protruding part 420 that is thermally expanded by heating the furnace body lower part 4 during the growth of the SiC epitaxial wafer. When a fitting part 320A fits the protruding part 420, it is possible to suppress the gas to be supplied into the furnace body 2 from flowing out of the furnace body 2 and the gas outside the furnace body 2 from flowing into the furnace body 2. That is, although the furnace body 2 is separated, the gas flow in the growth space R can be controlled, and a high-quality SiC epitaxial wafer can be manufactured.

In the present embodiment, a structure of the fitting part 320 includes the upper part 321, the end part 322, and the hanging part 323, and the upper part 321, the end part 322, and the hanging part 323 are substantially orthogonal to each other. However, the structure of the fitting part 320 is not limited to this as long as the fitting part 320 fits the protruding part 420. For example, a section may be a part of a polygonal structure other than a substantially rectangular shape, such as a substantially circular shape, a substantially elliptical shape, or a substantially triangular shape.

The number of fitting parts 320 can be appropriately selected as long as the fitting part fits the protruding part 420 and has a structure without a gap between the furnace body upper part 3 and the furnace body lower part 4. Depending on a size of the fitting part 320, two or more fitting parts 320 are preferably disposed, and three or more fitting parts 320 are more preferably disposed. In order to fit stably even if the fitting part 320A is missing, two fitting parts 320A, a total of six may be disposed for each position approximately the same in a circumferential direction. In addition, in a case where a plurality of the fitting parts 320 are disposed, it is preferable to dispose the fitting parts symmetrically. In addition, when in the fitting part 320 a lower end of the side part 32 of the furnace body upper part 3 is disposed over the entire circumferential direction, it becomes more difficult for the gap between the furnace body upper part 3 and the furnace body lower part 4 becomes to be formed.

When the number of the fitting parts 320A is reduced, the heat of the furnace body lower part 4 is not easily transmitted to the furnace body upper part 3, which is preferable.

When a material of the furnace body 2 is graphite, the surface is rough. Therefore, heat conduction in the fitting part 320A can be suppressed, which is preferable.

The size of the fitting parts 320 can be appropriately selected as long as the fitting part fits the protruding part 420 at the time of manufacturing a SiC epitaxial wafer and has a configuration in which the furnace body upper part 3 stably supports the furnace body lower part 4. The size of the fitting part 320 is preferably reduced. For example, a distance from the inner wall of the end part 322 to a vertical line down toward an extension line of the outer wall 32B of the side part 32 can be set to 10 mm, more preferably 2 mm or less, and still more preferably 1 mm or less. When reducing the size of the fitting part 320, heat from the furnace body lower part 4 can be prevented from being transmitted to the furnace body upper part 3. In consideration of the suppression of the heat conduction and a fitting manner, a contact area between the furnace body upper part 3 and the furnace body lower part 4, such as the number, position, and size of the fitting part 320 can be appropriately selected.

The furnace body lower part 4 includes a bottom part 41 and a side wall 42. At the bottom part of the furnace body lower part 4, the mounting table 5 is positioned. The side wall 42 of the furnace body lower part 4 extends in a direction substantially orthogonal to the bottom part 41. In addition, the side wall 42 is provided with a second hole 43 and the protruding part 420.

(Second Hole)

The second hole 43 is positioned at the side wall 42 of the furnace body lower part 4. The second hole 43 is positioned at a lower side than the mounting surface 5A of the mounting table 5 in the furnace body lower part 4. The second hole 43 is an exhaust port that exhausts the gas in the growth space R. The second hole 43 is, for example, an exhaust port that exhausts gases such as an unreacted gas after passing through the SiC wafer W and a purge gas. Vacuum suction can be performed through the second hole 43, and a pressure inside the furnace body 2 can be adjusted as appropriate. A plurality of the second holes 23 may be formed in the furnace body lower part 4 in order to increase symmetry of a gas flow path inside the furnace body 2 and to improve an in-plane uniformity of the epitaxial film.

In the chemical vapor deposition apparatus 1 according to the present embodiment, the protruding part 420 is positioned at an upper end of the side wall 42. The protruding part 420 extends in a direction substantially orthogonal to the side wall 42 and is hung on the hanging part 323.

In addition, the protruding part 420 is thermally expanded when heated for forming the SiC epitaxial film. The thermally expanded protruding part 420 contacts the upper part 321, the end part 322, and the hanging part 323 of the fitting part, and fits the fitting part 320. When the protruding part 420 fits the fitting part 320, the furnace body lower part 4 is stably supported by the furnace body upper part 3.

When the protruding part 420 is too large relative to the fitting part 320, there is a concern that the furnace body 2 may break. Also, when the protruding part 420 is too small relative to the fitting part 320, there is a concern that there may be a gap between the furnace body upper part 3 and the furnace body lower part 4 or the furnace body lower part 4 is not connected to the furnace body upper part 3. Therefore, the number, a position, and a size of the protruding part 420 are selected as appropriate according to the scale of the furnace body 2 or a size of the fitting part 320 such that a crack of the furnace body 2 or poor connection between the furnace body upper part 3 and the furnace body lower part 4 does not occur.

When the protruding part 420 is fitted to the fitting part 320, outflow and inflow of the gas inside and outside the furnace body 2 can be suppressed. When the outflow and inflow of the gas inside and outside the furnace body 2 is suppressed, the gas flow in the growth space R can be controlled, and a high-quality SiC epitaxial wafer can be manufactured.

Around the furnace body lower part 4, heating device 6 is disposed. When heating device is disposed around the furnace body lower part, the furnace body lower part 4 can be more effectively heated compared to the furnace body upper part 3. That is, the temperature of the furnace body lower part 4 can be set to a high temperature, and an increase in the temperature of the furnace body upper part 3 can be suppressed. Therefore, the time required for raising and lowering the temperature of the furnace body 2 can be reduced.

A thickness of the furnace body 2 is preferably 10 mm or less, more preferably 7.5 mm or less, and still more preferably 5 mm or less, because the thinner the thickness, the lower the thermal conductivity.

In addition, the thickness of the furnace body 2 is preferably 0.5 mm or more because there is a concern that when the thickness is too thin, sufficient durability may not be obtained, more preferably 2 mm or more from the viewpoint of ease of processing, and still more preferably 3 mm or more, from the viewpoint of strength.

The inner wall 32A of the side part 32 of the furnace body upper part 3 and an inner wall 42A of the side wall 42 of the furnace body lower part 4 are preferably substantially flush with each other. The expression "substantially flush" means that the inner wall 32A and the inner wall 42A spread in substantially the same plane. The inner wall 32A and the inner wall 42A are substantially flush with each other, whereby it is possible to prevent the gas flow from being disturbed. That is, it is possible to suppress the deposit from adhering to the inside of the furnace body 2 due to gas flow disturbance and to manufacture a high-quality SiC epitaxial wafer with high throughput.

According to the SiC chemical vapor deposition apparatus 1 of the present embodiment, it is possible to reduce the amount of heat transmitted from the furnace body lower part 4 to the furnace body upper part 3 and to prevent the furnace body upper part 3 from becoming a high temperature.

In addition, the furnace body upper part 3 and the furnace body lower part 4 are separated structures. Therefore, even in a case where either the furnace body upper part 3 or the furnace body lower part 4 is necessary to be replaced due to deterioration such as the adhesion of deposition or the like, only the member that is necessary to be replaced need be replaced. That is, the cost of manufacturing the SiC epitaxial wafer can be reduced.

In addition, since the furnace body upper part 3 and the furnace body lower part 4 fit each other, there is no gap between the furnace body upper part 3 and the furnace body lower part 4 and inflow and outflow of the gas at the position can be suppressed.

In the present embodiment, a configuration in which the fitting part 320 is provided in the furnace body upper part 3 and the protruding part 420 is provided in the furnace body lower part is described. However, a configuration in which the fitting part is provided in the furnace body lower part 4 and the protruding part is provided in the furnace body upper part may be adopted.

Second Embodiment

Figure 2:
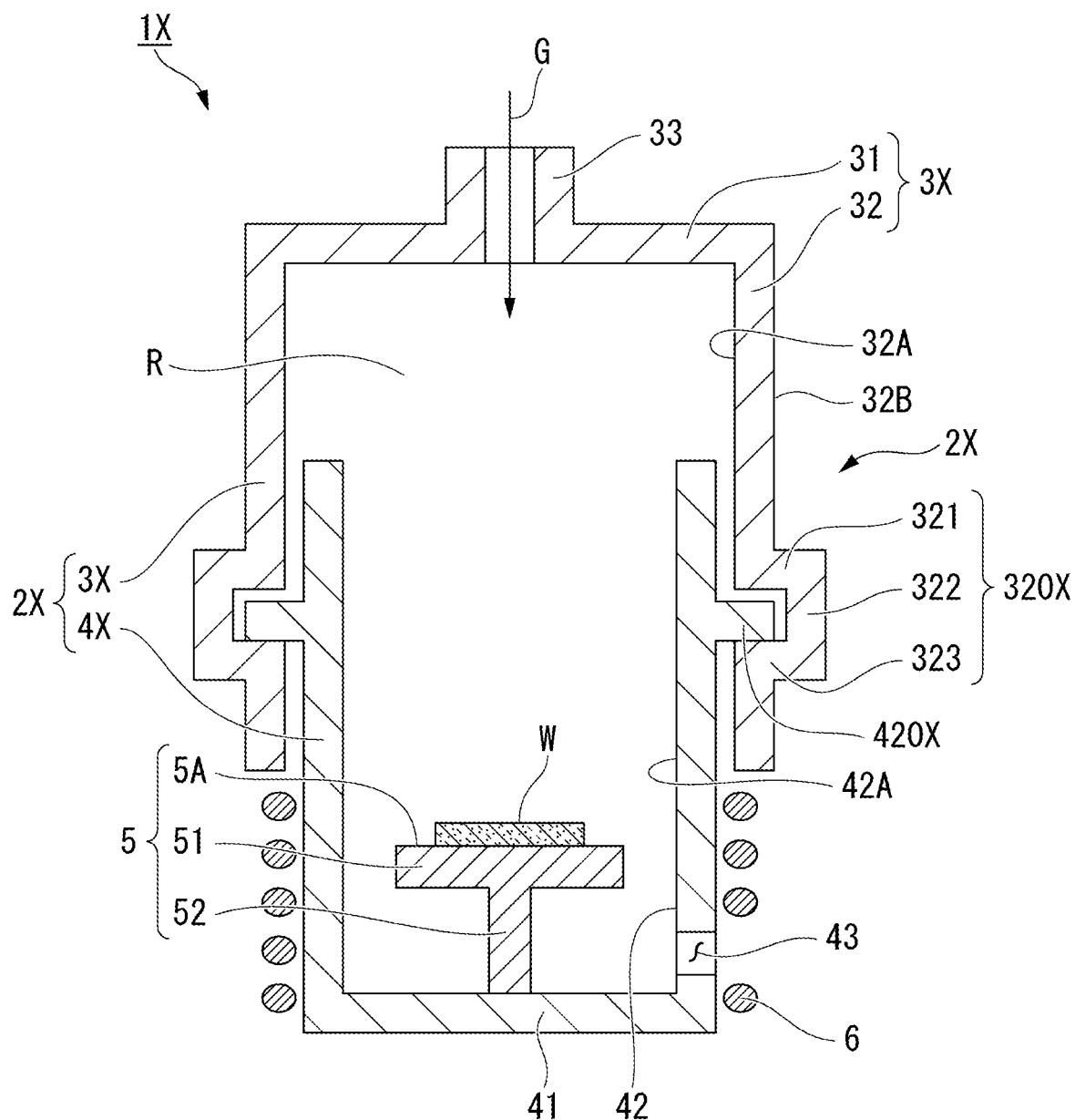
FIG. 2 is a schematic sectional diagram of a chemical vapor deposition apparatus according to an embodiment of the present invention.

FIG. 2 is a schematic sectional diagram of a SiC chemical vapor deposition apparatus 1X according to a second embodiment. The SiC chemical vapor deposition apparatus 1X according to the second embodiment is different from the SiC chemical vapor deposition apparatus 1 according to the first embodiment in a structure of a furnace body 2X. Other configurations are the same, are denoted by the same reference numerals, and description thereof is omitted.

The chemical vapor deposition apparatus 1X shown in FIG. 2 includes the furnace body 2X and the mounting table 5. The furnace body 2X includes a furnace body upper part 3X and a furnace body lower part 4X. The furnace body upper part 3X includes a fitting part 320X. The fitting part 320X is positioned in the middle of the side part 32 of the furnace body upper part 3X in a vertical direction. The side part 32 extends downward from the fitting part 320X. In addition, the furnace body lower part 4X includes a protruding part 420X. The protruding part 420X is positioned in the middle of the furnace body lower part 4X in a vertical direction. The side wall 42 extends upward from the protruding part 420X. In the chemical vapor deposition apparatus 1X, positions of the fitting part 320X and the protruding part 420X are different from the chemical vapor deposition apparatus 1 shown in FIG. 1.

The furnace body lower part 4X is an example of the first portion, and the furnace body upper part 3X is an example of the second portion.

Furthermore, since a positional relationship between the fitting part 320X and the protruding part 420X is different, the furnace body lower part 4X is enclosed by the furnace body upper part 3X. An outer wall of the furnace body lower part 4X comes into contact with the inner wall 32A of the furnace body upper part 3X. Alternatively, the outer wall of furnace body lower part 4X is positioned on a more inner side than the inner wall 32A of furnace body upper part 3X.

The protruding part 420X is thermally expanded when heated for forming the SiC epitaxial film. The thermally expanded protruding part 420X is fitted to the fitting part 320X. When the protruding part 420X fits the fitting part 320X, the furnace body lower part 4 is stably supported by the furnace body upper part 3.

According to the SiC chemical vapor deposition apparatus 1X of the second embodiment, the same effect as in the SiC chemical vapor deposition apparatus 1 of the first embodiment can be obtained.

In the present embodiment, a configuration in which the fitting part 320X is provided in the furnace body upper part 3X and the protruding part 420X is provided in the furnace body lower part 4X is described. However, a configuration in which the fitting part is provided in the furnace body lower part and the protruding part is provided in the furnace body upper part may be adopted.

Third Embodiment

Figure 3:
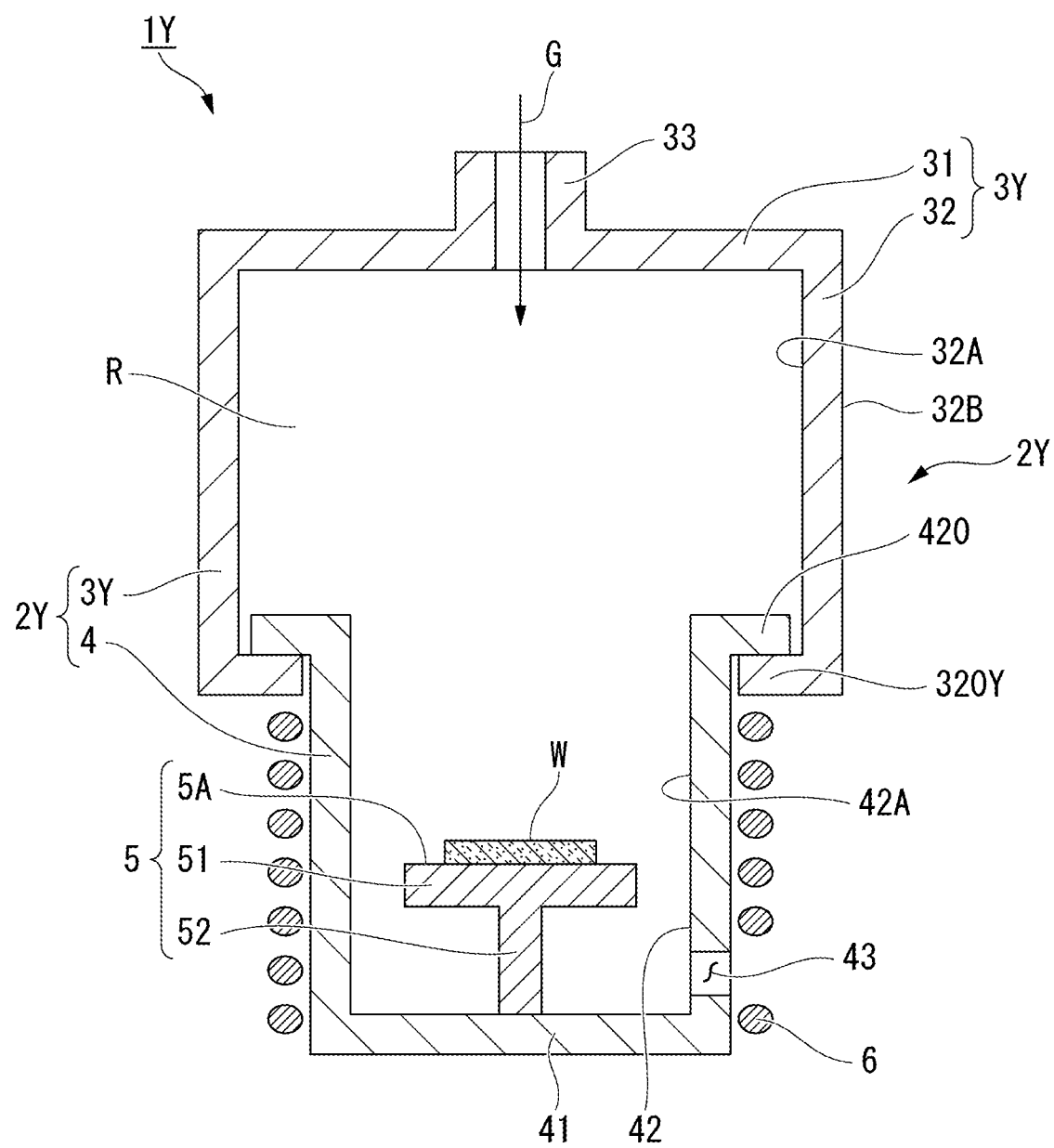
FIG. 3 is a schematic sectional diagram of a chemical vapor deposition apparatus according to an embodiment of the present invention.

FIG. 3 is a schematic sectional diagram of a SiC chemical vapor deposition apparatus 1Y according to a third embodiment. The SiC chemical vapor deposition apparatus 1Y according to the third embodiment is different from the SiC chemical vapor deposition apparatus 1 according to the first embodiment in a structure of a furnace body 2Y. Other configurations are the same, are denoted by the same reference numerals, and description thereof is omitted.

The chemical vapor deposition apparatus 1Y shown in FIG. 3 includes the furnace body 2Y and the mounting table 5. The furnace body 2Y includes a furnace body upper part 3Y and the furnace body lower part 4. The furnace body upper part 3Y includes a hook part 320Y in place of the fitting part 320A. The hook part 320Y is positioned at the lower end of side part 32. The hook part 320Y is substantially orthogonal to the side part 32 and hangs the protruding part 420. The hook part 320Y and the protruding part 420 are hooked such that there is no gap, and the furnace body upper part 3Y and the furnace body lower part 4 are connected to each other.

An inner diameter of the furnace body upper part 3Y is larger than an outer diameter of the furnace body lower part 4.

The protruding part 420 is thermally expanded when heated for forming the SiC epitaxial film. The thermally expanded protruding part 420 is in close contact with the hook part 320Y. When the protruding part 420 is in close contact with the hook part 320Y, the furnace body lower part 4 is stably supported by the furnace body upper part 3Y.

The furnace body lower part 4 is an example of the first portion, and the furnace body upper part 3Y is an example of the second portion.

According to the SiC chemical vapor deposition apparatus 1Y of the third embodiment, the same effect as in the SiC chemical vapor deposition apparatus 1 of the first embodiment can be obtained.

Fourth Embodiment

Figure 4:
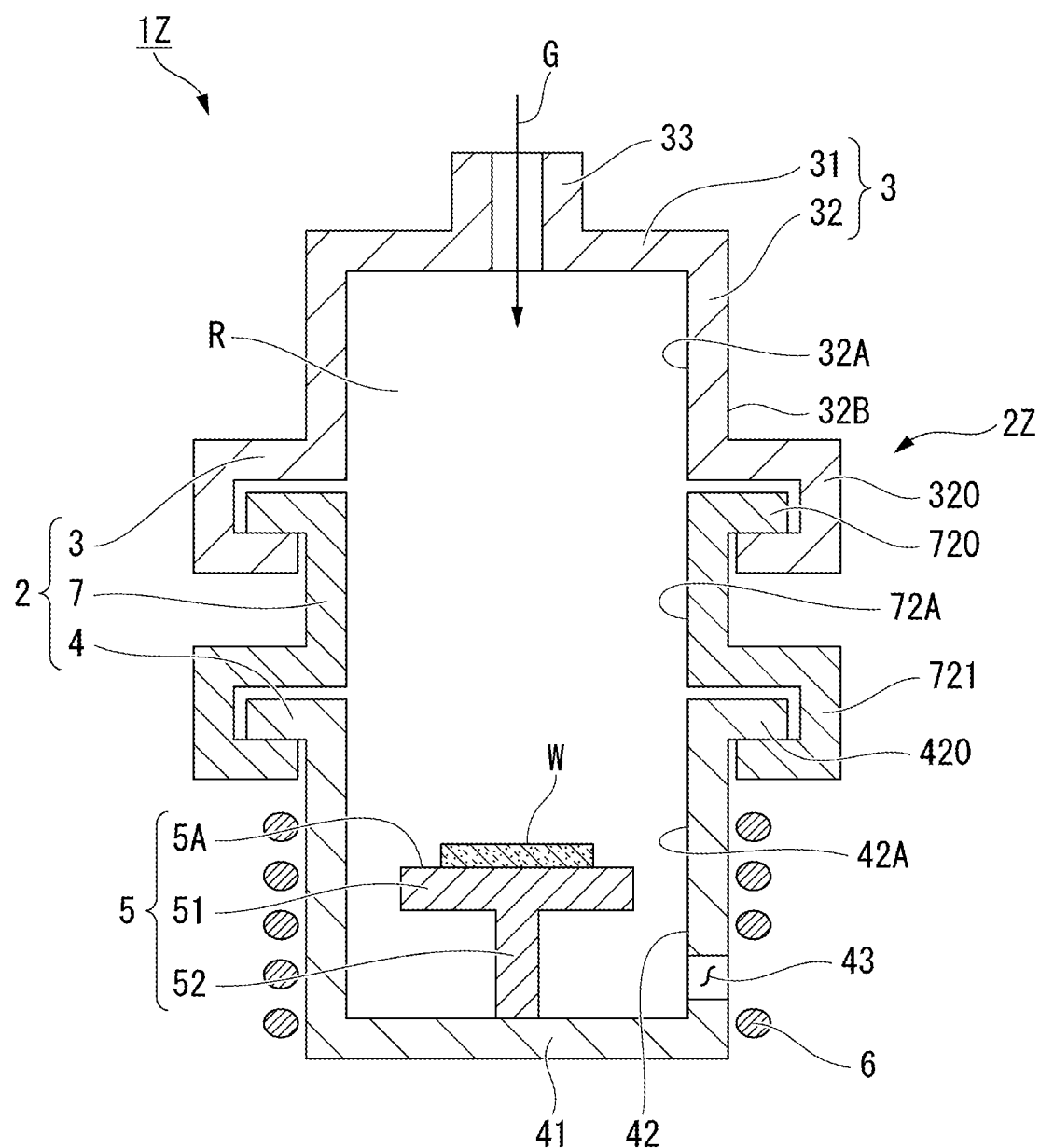
FIG. 4 is a schematic sectional diagram of a chemical vapor deposition apparatus according to an embodiment of the present invention.

FIG. 4 is a schematic sectional diagram of a SiC chemical vapor deposition apparatus 1Z according to a fourth embodiment. The SiC chemical vapor deposition apparatus 1Z according to the third embodiment is different from the SiC chemical vapor deposition apparatus 1 the first embodiment, in a structure of a furnace body 2Z. That is, the furnace body 2Z has at least one furnace body middle part 7 between the furnace body upper part 3 and the furnace body lower part 4. Other configurations are the same, are denoted by the same reference numerals, and description thereof is omitted.

In FIG. 4, when the furnace body lower part 4 is the first portion, the furnace body middle part 7 is the second portion. When the furnace body middle part 7 is the first portion, the furnace body upper part 3 is the second portion. In a case where a plurality of the furnace body middle parts are provided, it is possible to appropriately select a member having a fitting part as the second portion and a member having a protruding part that protrudes to be fitted to the fitting part as the first portion.

The chemical vapor deposition apparatus 1Z shown in FIG. 4 includes the furnace body middle part 7 between the furnace body upper part 3 and the furnace body lower part 4. The furnace body middle part 7 includes a fitting part 720 having the same configuration as the fitting part 320 of the furnace body upper part 3 and a protruding part 721 having the same configuration as the protruding part 420 of the furnace body lower part. A thickness of the furnace body middle part 7 is the same as those of the furnace body upper part 3 and the furnace body lower part 4, and the inner wall 32A of the furnace body upper part 3, an inner wall 72A of the furnace body middle part 7, and the inner wall 42A of the furnace body lower part 4 are preferably substantially flush with one another.

According to the SiC chemical vapor deposition apparatus 1Z of the present embodiment, the thermal conduction from the furnace body lower part 4 to the furnace body upper part 3 of the first embodiment can further be suppressed.

(Method of Manufacturing SiC Epitaxial Wafer)

According to a method of manufacturing a SiC epitaxial wafer of the present embodiment, it is possible to manufacture a SiC epitaxial wafer by using the chemical vapor deposition apparatus of the above embodiment, by a known method. According to the method of manufacturing a SiC epitaxial wafer of the present embodiment, it is possible to suppress the temperature increase of the furnace body upper part and to provide a high-quality SiC epitaxial wafer with high throughput and low cost.

Hereinabove, the preferred embodiments of the present invention have been described in detail, but the present invention is not limited to a specific embodiment, and various modifications and changes can be made within the scope of the present invention described in the claims.

EXPLANATION OF REFERENCES 1, 1X, 1Y, 1Z Chemical vapor deposition apparatus
2, 2X, 2Y, 2Z Furnace body
3, 3X, 3Y Furnace body upper part
31 Top part
32 Side part
32A Inner wall
32B Outer wall
320, 320X, 721 Fitting part
320Y Hook part
33 First hole
4, 4X Furnace body lower part
41 Bottom part
42 Side wall
42A Inner wall
43 Second hole
420, 420X, 720 Protruding part
5 Mounting table
51 Support
52 Support column
5A Upper surface (Mounting surface)
6 Heating device
R Growth space
W Wafer

What is claimed is:
1. A SiC chemical vapor deposition apparatus, comprising:
a furnace body inside of which a growth space is formed; and
a mounting table which is positioned on a lower portion of the growth space and has a mounting surface on which a SiC wafer is mounted,
wherein the furnace body is separated into a plurality of members in a vertical direction substantially orthogonal to the mounting table,
the plurality of members includes a first portion having a main outer circumferential surface and a second portion having a main outer circumferential surface,
the first portion includes a protruding part that protrudes in an outer peripheral direction from the main outer circumferential surface of the first portion,
the second portion includes a hook part that protrudes in an outer peripheral direction from the main outer circumferential surface of the second portion on which the protruding part is hung, and the first portion and the second portion are connected to each other by hanging the hook part on the protruding part.

2. The SiC chemical vapor deposition apparatus according to claim 1,
wherein the furnace body is separated into a furnace body upper part and a furnace body lower part,
the first portion is the furnace body lower part, and
the second portion is the furnace body upper part.

3. The SiC chemical vapor deposition apparatus according to claim 1,
wherein the protruding part is positioned at an upper end of the first portion, and
the hook part is positioned at a lower end of the second portion.

4. The SiC chemical vapor deposition apparatus according to claim 1,
wherein the hook part is a fitting part that fits the protruding part, and
the fitting part is a portion recessed in the outer peripheral direction, in an inner surface of the furnace body upper part.

5. The SiC chemical vapor deposition apparatus according to claim 1,
wherein a thickness of the furnace body is 0.5 mm or more and 10 mm or less.

6. The SiC chemical vapor deposition apparatus according to claim 1,
wherein in the furnace body, an inner wall of the furnace body lower part and an inner wall of the furnace body upper part are substantially flush with each other.

7. The SiC chemical vapor deposition apparatus according to claim 1,
wherein the furnace body lower part is provided with heating device.

8. A method of manufacturing a SiC epitaxial wafer using the SiC chemical vapor deposition apparatus according to claim 1.

* * * * *